United States Patent [19]
Houston

[11] Patent Number: 5,404,327
[45] Date of Patent: Apr. 4, 1995

[54] MEMORY DEVICE WITH END OF CYCLE PRECHARGE UTILIZING WRITE SIGNAL AND DATA TRANSITION DETECTORS

[75] Inventor: Theodore W. Houston, Richardson, Tex.

[73] Assignee: Texas Instruments Incorporated, Dallas, Tex.

[21] Appl. No.: 131,103

[22] Filed: Oct. 4, 1993

Related U.S. Application Data

[63] Continuation of Ser. No. 830,214, Jan. 30, 1992, abandoned, which is a continuation of Ser. No. 683,116, Apr. 8, 1991, abandoned, which is a continuation of Ser. No. 593,357, Sep. 28, 1990, abandoned, which is a continuation of Ser. No. 213,814, Jun. 30, 1988, abandoned.

[51] Int. Cl.$^6$ ............... G11C 11/407; G11C 11/417
[52] U.S. Cl. ............................ 365/203; 365/194; 365/233; 365/233.5
[58] Field of Search ............... 365/203, 233, 233.5, 365/194

[56] References Cited

U.S. PATENT DOCUMENTS

| | | | |
|---|---|---|---|
| 4,337,525 | 6/1982 | Akatsuka | 365/233 |
| 4,592,026 | 5/1986 | Matsukawa et al. | 365/233.5 |
| 4,612,631 | 9/1986 | Ochii | 365/233.5 |
| 4,625,298 | 11/1986 | Sumi | 365/203 |
| 4,638,462 | 1/1987 | Rajeevakumar et al. | 365/233.5 |
| 4,712,194 | 12/1987 | Yamaguchi et al. | 365/203 |
| 4,744,063 | 5/1988 | Ohtani et al. | 365/203 |

*Primary Examiner*—Glenn Gossage
*Attorney, Agent, or Firm*—Peter T. Rutkowski; Richard L. Donaldson; William E. Hiller

[57] ABSTRACT

A memory device (10) having a precharge and timing control circuit (24) is configured so that a precharge state occurs at the end of memory cycles. A precharge signal remains active until a change of address is detected by an address transition detector (14). This address change causes a word line controller (86) to activate memory word lines (20), a precharge controller (82) to deactivate the precharge signal, and a sense amp latch controller (88) to enable sense amplifiers within a write and sense amplifier control circuit (38). After a sufficient amount of time has transpired for either a write operation to occur or for valid data to be detected in the sensing amplifiers, the word line controller (86) deactivates the word lines (20), the sense amp latch controller (88) latches the sense amplifiers, and the precharge controller (82) activates the precharge signal. During a read memory cycle, the precharge signal is active while valid data propagates through output stages (38, 18, 40) of the memory device (10). During a write memory cycle, write control signal or data signal transitions are detected to control the precharge signal.

6 Claims, 3 Drawing Sheets

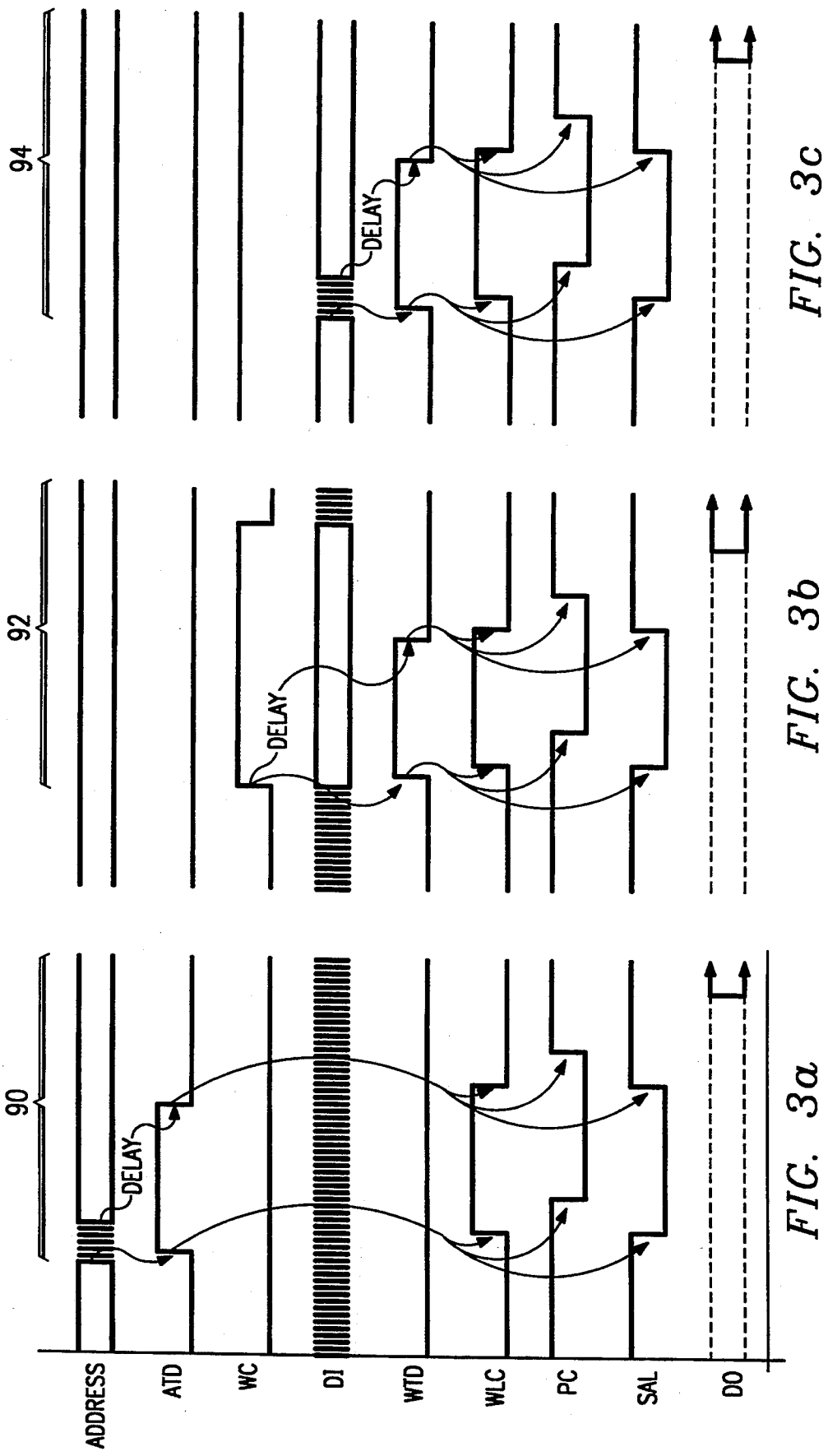

MEMORY DEVICE WITH END OF CYCLE PRECHARGE UTILIZING WRITE SIGNAL AND DATA TRANSITION DETECTORS

This application is a continuation of application Ser. No. 07/830,214, filed on Jan. 30, 1992, now abandoned, which is a continuation of application Ser. No. 07/683,116, filed on Apr. 8, 1991, now abandoned, which is a continuation of application Ser. No. 07/593,357, filed on Sep. 28, 1990, now abandoned, which is a continuation of application Ser. No. 07/213,814, filed on Jun. 30, 1988, now abandoned.

TECHNICAL FIELD OF THE INVENTION

The present invention relates generally to semiconductor memory devices. More specifically, the present invention relates to the control of such memory devices to reduce memory cycle access time.

BACKGROUND OF THE INVENTION

A conventional random access memory (RAM) device must experience several delay stages before data stored therein may be recalled or supplied at an output of the memory device. For example, when an address value supplied to the memory device changes to a new address value, a conventional memory device must experience a first stage of delay associated with detecting the change in address and allowing the address to stabilize. After the change in address has been detected, a second stage of delay occurs while bit lines of a memory cell array are equalized, or precharged. This precharging imposes a predetermined voltage on the bit lines, and this predetermined voltage may later be influenced by the programming of specifically addressed memory cells. After the precharge stage of delay, a third stage of delay occurs while the precharge signals are deactivated and bit lines respond to a selected memory cell so that data corresponding to the programming of the addressed cell in the memory cell array appears at an input of a sense amplifier. Once sense amplifiers have sensed valid data on the bit lines, a fourth stage of delay occurs, which is associated with propagation delays of sense amplifiers and subsequent circuitry between the sense amplifiers and the output of the memory device, such as output buffers.

Moreover, in conventional memory devices, the precharge stage of delay consumes a constant period of time which is as short as possible. This precharge period is constant regardless of whether a prior memory access cycle was a read cycle or a write cycle and may occupy one fourth or more of an entire read access cycle. Furthermore, this precharge period is as short as possible because it occurs in series with other stages of delay which directly impact memory access time. However, when read cycles occur immediately following a write cycle, a stronger precharge is needed because full logic swings are conventionally developed on bit lines during a write cycle as opposed to small differential voltages which are developed on bit lines during a read cycle. Therefore, conventional memories utilize undesirably large precharge devices to accommodate this worst case situation where a read memory access cycle occurs immediately following a write memory access cycle.

Consequently, a need exists for a memory device in which a precharge stage occurs at the end of read and write cycles so that the precharge stage does not impact read access time of a subsequent memory read access cycle. Moreover, a need exists for a memory device in which a precharge stage occurs at the end of write cycles to accommodate a longer duration precharge time so that smaller precharge devices may be used.

SUMMARY OF THE INVENTION

Accordingly, it is an advantage of the present invention that an improved memory device in which read access times are reduced is provided.

Another advantage of the present invention is that a memory device is provided in which precharge occurs at the end of read cycles while data propagates through output buffering stages of the memory device so that subsequent read cycles need not be delayed by precharge requirements.

Still another advantage of the present invention is that a memory device having precharge at the end of write cycles is provided so that subsequent read cycles are not delayed by a precharge stage and/or so that a longer duration precharge period occurs, allowing the use of smaller precharge devices.

The above and other advantages of the present invention are carried out in one form by a memory device having a memory cell array, a sense amplifier, a latch controller, a word line controller, and a precharge controller. The memory cell array has at least one bit line and at least one word line. The word line is activated during memory cycles to transfer data into or out from the memory access array. The sense amplifier has a data input which couples to the bit line of the memory cell array. The latch controller couples to a latch control input of the sense amplifier and causes the sense amplifier to latch data present on the bit line at a first instant in time within a memory access cycle. The word line controller couples to the word line of the memory cell array and deactivates the word line at around the first instant in time. In addition, the precharge controller couples to the bit line of the memory cell array and supplies an active precharge signal to the bit line at around the first instant in time.

BRIEF DESCRIPTION OF THE DRAWINGS

A more complete understanding of the present invention may be derived by referring to the detailed description and claims when considered in connection with the FIGURES, wherein like reference numbers refer to similar items throughout the FIGURES, and:

FIGS. 3A–3C show timing diagrams which describes the operation of the precharge and timing control circuit shown in FIG. 2;

DETAILED DESCRIPTION OF THE PREFERRED EMBODIMENTS

Figure 1:
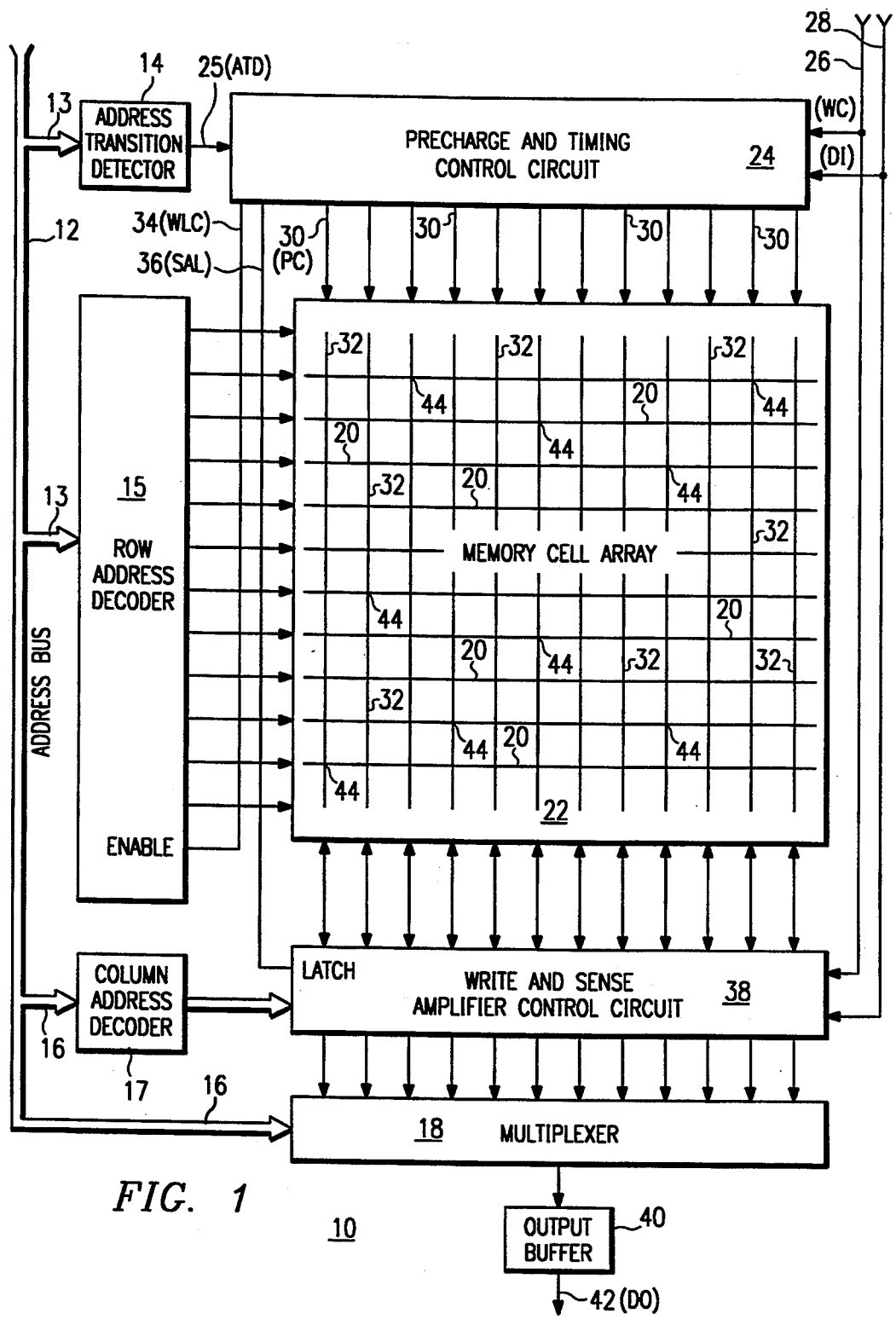
FIG. 1 shows a simplified block diagram of a memory device constructed in accordance with the present invention.

FIG. 1 shows a simplified block diagram of a memory device 10 constructed in accordance with the present invention. In the preferred embodiment of the present invention, memory device 10 represents a static RAM. In FIG. 1, memory device 10 is connected to receive an address bus 12. A row address portion 13 of address bus 12 couples to an address transition detector 14 and to a row address decoder 15. A column address portion 16 of address bus 12 couples to a column address decoder 17 and to selection inputs of a multiplexer 18. Outputs from row address decoder 15 couple to word lines 20 of a memory cell array 22. Moreover, an output of address transition detector 14 couples to a first control input of a precharge and timing control circuit 24 at a node 25. A write control signal and a data input signal received by memory device 10 couple to second and third control inputs at nodes 26 and 28, respectively, of precharge and timing control circuit 24. Precharge output nodes 30 of precharge and timing control circuit 24 couple to bit lines 32 of memory cell array 22. Moreover, a word line enable output node 34 from precharge and timing control circuit 24 couples to an enable input of row address decoder 15, and a sense amplifier latch output 36 of precharge and timing control circuit 24 couples to a latch control input of a write and sense amplifier control circuit 38 of memory device 10. Bit lines 32 of memory cell array 22 each additionally couple to unique inputs of write and sense amplifier control circuit 38, and the write control signal and data input signal at nodes 26 and 28, respectively, couple to inputs of write and sense amplifier control circuit 38. In addition, data outputs of write and sense amplifier control circuit 38 couple to data inputs of multiplexer 18, and a data output of multiplexer 18 couples to an input of an output buffer 40. An output node 42 of output buffer 40 provides a data output signal from memory device 10.

Memory cell array 22 contains a multiplicity of semiconductor memory cells 44. Each of memory cells 44 is located at an intersection between a word line 20 and a bit line 32. Thus, memory cells 44 are arranged in an array of rows and columns. Each of cells 44 is intended to store one bit of data when memory device 10 represents a one bit wide memory device or more bits of data if memory device 10 represents a memory device that saves more than one bit of data at each address. A particular one of memory cells 44 is selected for a read operation by an address value supplied on address bus 12 and decoded by row address decoder 15 and the column address supplied to the selection input of multiplexer 18. A particular one of memory cells 44 is selected for a write operation by an address value supplied on address bus 12 and decoded by row address decoder 15 and column address decoder 17. In a "memory cycle" or a "memory access cycle" memory device 10 performs either one, but not both, of a read operation or a write operation. In the preferred embodiment, row address decoder 15, column address decoder 17 and memory cell array 22 represent conventional memory structures which may advantageously be implemented in a conditional fashion in the present invention.

Address transition detector 14 monitors each bit of the row address portion of the address value presented on bus 12 to detect when this row address value changes. The output signal at node 25 from address transition detector 14 represents a pulse which activates to indicate when one of these address bits changes logical states. When this event occurs, the output signal from address transition detector 14 commands precharge and timing control circuit 24 to generate an appropriate sequence of timing and control signals so that a read or write operation may be performed to a specified memory cell 44 in memory cell array 22.

Specifically, precharge and timing control circuit 24 controls the application of a precharge signal to bit lines 32 of memory cell array 22. When this precharge signal is in an active state, circuit 24 introduces a predetermined voltage level on each of bit lines 32 of memory cell array 22. In a read operation, this predetermined voltage is then influenced by the programming of cells 44 in memory cell array 22. In particular, cells 44 residing on a word line 20 which is specified by row address portion 13 of address bus 12 may force corresponding bit lines 32 to an opposite logical state from the precharge state, depending upon the programming of such cells. If such memory cells 44 are not programmed, then they have a random influence on this predetermined voltage established on bit lines 32. Write and sense amplifier control circuit 38 detects voltages on bit lines 32, and multiplexer 18 selects a particular column, or bit line 32, as a source of data output from memory device 10.

However, in a write operation, data is introduced on a bit line 32 and word line 20 specified by column address portion 16 of address bus 12 and row address portion 13 of address bus 12 at appropriate voltage levels so that the specified cell 44 may be programmed in accordance with data presented at data input node 28. In the preferred embodiment of the present invention, address transition detector 14, write and sense amplifier control circuit 38, multiplexer 18, and output buffer 40 represent conventional structures in the fabrication of memory devices, and conventional implementations for these structures are contemplated by the present invention.

Figure 2:
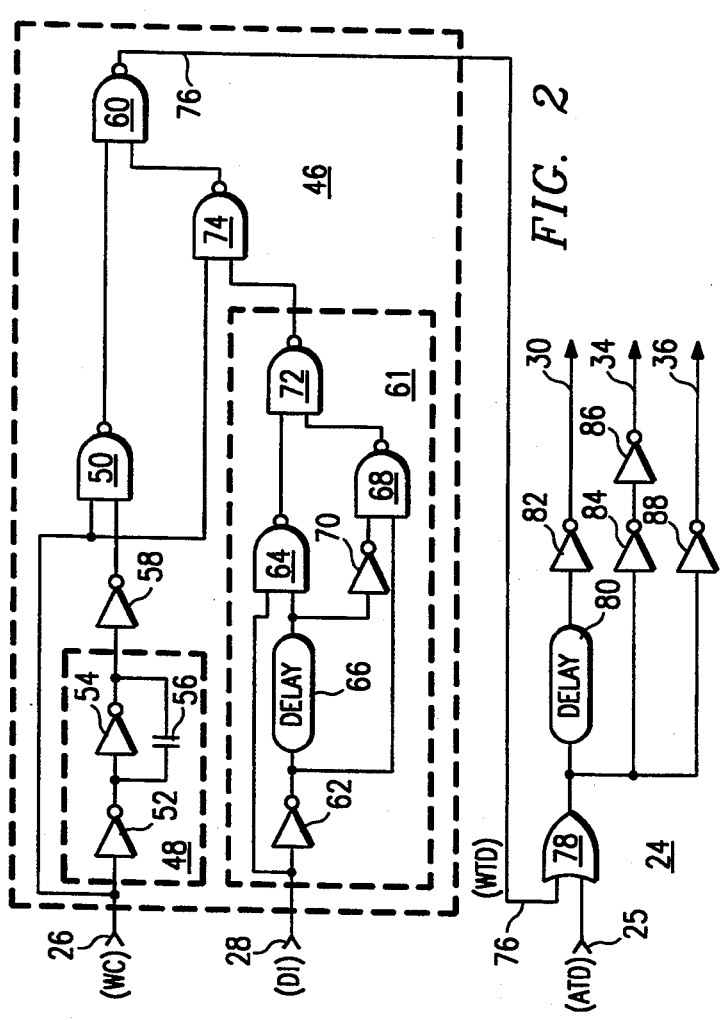
FIG. 2 shows a first embodiment of a logic diagram of a precharge and timing control circuit portion of the memory device shown in FIG. 1.

FIG. 2 shows a first embodiment of a logic diagram of precharge and timing control circuit 24. In FIG. 2, node 26, which supplies the write control signal discussed above, couples to a first input of a write detector portion 46 of control circuit 24. In write detector 46, node 26 couples to an input of a delay element 48 and a first input of a NAND element 50. Delay element 48 includes an inverter 52, having an input which couples to node 26 and serves as the input of delay element 48, and an output which couples to an input of an inverter 54 and a first node of a capacitor 56. An output of inverter 54 serves as an output of delay element 48 and couples to a second node of capacitor 56. The output of delay element 48 couples to an input of an inverter 58, and an output of inverter 58 couples to a second input of NAND element 50. An output of NAND element 50 couples to a first input of a NAND element 60.

Node 28, which supplies the data input signal discussed above, couples to an input of a data transition detector portion 61 of control circuit 24. Specifically, node 28 couples to a second control input of write detector 46 at an input of an inverter 62 and a first input of a NAND element 64. An output of inverter 62 couples to an input of a delay element 66 and a first input of a NAND element 68. In the preferred embodiment, delay element 66 represents a conventional delay element known to those skilled in the art, such as a delay element similar to delay element 48, discussed above. An output of delay element 66 couples to a second input of NAND element 64 and to an input of an inverter 70. An output of inverter 70 couples to a second input of NAND element 68. An output of NAND element 64 couples to a first input of a NAND element 72, and an output of NAND element 68 couples to a second input of NAND element 72. An output of NAND element 72 couples to a first input of a NAND element 74, and node 26 couples to a second input of NAND element 74. An output of NAND element 74 couples to a second input of NAND element 60, and an output of NAND element 60 couples to a node 76 and provides a write detection pulse which serves as the output of write detector 46.

Node 76 couples to a first input of an OR element 78, and node 25, which supplies the address transition detection pulse discussed above, couples to a second input of OR element 78. An output of OR element 78 couples to an input of a delay element 80, and an output of delay element 80 couples to an input of an inverter 82. Delay element 80 represents an optional structure in the preferred embodiment and may be implemented using conventional techniques when included. Inverter 82 serves as a precharge controller, and an output thereof provides a precharge signal to node 30. Of course, those skilled in the art will recognize that a multiplicity of inverters, each having inputs coupled to the input of inverter 82, may drive the multiplicity of nodes 30 shown in FIG. 1. Alternatively, the output of inverter 82 may simply act as an enable signal which, when activated, causes a predetermined voltage to be coupled to bit lines 32 (see FIG. 1).

In addition, the output of OR element 78 couples to an input of an inverter 84, and an output of inverter 84 couples to an input of an inverter 86. Inverter 86 serves as a word line controller, and an output thereof activates word lines 20 of memory cell array 22 by enabling row address decoder 15 (see FIG. 1). The output of OR element 78 additionally couples to an input of an inverter 88. Inverter 88 serves as a latch controller, and an output thereof couples to latch control input node 36 of write and sense amplifier control circuit 38 (see FIG. 1).

The operation of the first embodiment of precharge and timing control circuit 24 is illustrated by the timing diagram shown in FIGS. 3a, 3b, and 3c. FIGS. 3a, 3b, and 3c depict three memory cycles, labeled cycles 90, 92, and 94. Cycle 90 represents a memory read cycle, and cycles 92 and 94 represent memory write cycles. Read cycle 90 begins in FIG. 3A by a change in address value presented on address bus 12 (see FIG. 1). This change in address value is detected in address transition detector 14 (see FIG. 1), which asserts an address transition detection pulse (ATD) on node 25 in response. A leading edge of the ATD pulse occurs a small propagation delay after an initial change in address value, and a trailing edge of the ATD pulse occurs a predetermined period of time after the changed address value becomes stable.

The structure utilized for address transition detector 14 in the preferred embodiment of the present invention is conventional for address transition detectors, and may advantageously resemble data transition detector 61, shown in FIG. 2, for each bit of address bus 12 (see FIG. 1) monitored by address transition detector 14. Utilizing such an address transition detector 14, the pulse width of the ATD pulse is conventionally determined by a delay element similar to delay element 66 shown in FIG. 2.

Since memory cycle 90 represents a read cycle, the write control signal (WC) exhibits a logical low or inactive level throughout the cycle, and the data in signal (DI) may exhibit any value. A write transition detection signal (WTD) shown in FIG. 3B is output by write detector 46 at node 76 (see FIG. 2). Since the write control signal (WC) supplied at node 26 remains inactive throughout read cycle 90, the WTD signal also remains inactive throughout read cycle 90.

A precharge signal (PC) is generated by inverter 82, a word line control signal (WLC) is generated by inverter 86, and a sense amplifier latch (SAL) signal is generated by inverter 88. These signals are each shown as exhibiting a logical high for an active state in FIGS. 3A–3C. However, those skilled in the art will recognize that such signals, and any other signals connected with the present invention, may exhibit different polarities from those shown. During read cycle 90, the WTD signal remains low, but the ATD pulse supplied at node 25 passes through OR element 78 to cause the word line control signal (WLC) to exhibit an active state and to cause the sense amp latch signal (SAL) and precharge signal (PC) to exhibit inactive states in response to a leading edge of the ATD pulse. Delay element 80 (see FIG. 2) inserts a minor optional delay in the precharge signal (PC) relative to the word line control signal (WLC) and sense amp latch signal (SAL). Thus, the period of time by which the PC signal trails the WL and SAL signals in cycle 90 of FIG. 3A is determined by delay element 80.

As the WLC signal activates, it enables a particular row of cells 44 in memory cell array 22 (see FIG. 1). As the SAL signal deactivates, write and sense amplifier control circuit 38 is enabled so that the sense amplifier outputs thereof may change. While the PC signal exhibits the inactive state, data programmed into a memory cell 44 (see FIG. 1) may influence the precharge voltage previously applied to bit lines 32, and this influence may be sensed by sense amplifiers of write and sense amplifier control circuit 38.

The trailing edge of the ATD pulse propagates through OR element 78, latch controller inverter 88, and word controller inverter 86 to cause write and sense amplifier control circuit 38 to latch data sensed thereby and to disable a word line 20 of memory cell array 22. After a short delay imposed by delay element 80 (see FIG. 2), the PC signal exhibits the active state, and memory device 10 (see FIG. 1) enters a precharge state. The delay imposed by delay element 80 in the present embodiment causes the PC signal to enter the active state after the trailing edge of the SAL signal. In addition, after the latching of sense amplifier circuit 38 at the trailing edge of the SAL signal, the data recalled from memory cell array 22 propagates through write and sense amplifier control circuit 38, multiplexer 18, and output buffer 40 (see FIG. 1) and eventually provides valid output data, as shown in the data out signal (DO) in read cycle 90 of FIG. 3A. Thus, the trailing edges of the word line control signal (WL) pulse, the sense amp latch signal (SAL) pulse, and the precharge signal (PC) pulse all occur at around a single-instant in time, which is intermediate between the beginning and end of read cycle 90. Moreover, the precharge signal becomes active prior to the end of read cycle 90 while data propagates through output sections of memory device 10 (see FIG. 1).

Memory cycle 92 represents a write cycle. In write cycle 92, the address value presented to memory device 10 (see FIG. 1) does not change. Therefore, the address transition detection signal (ATD) remains at a logical low level. However, in write cycle 92, the write control signal (WC) forms a pulse, and the leading edge of this WC pulse generates a write transition detection pulse (WTD) shown in FIG. 3B. For write cycle 92, the data input signal (DI) to memory device 10 (see FIG. 1)

remains constant throughout the duration of write cycle 92. Referring to FIG. 2, this write transition detection (WTD) pulse is detected by delay element 48, inverter 58, NAND element 50, and NAND element 60. NAND element 50, inverter 58, and delay element 48 cooperate to establish the duration of the write transition detection (WTD) pulse and to ensure that this pulse occurs only at the leading edge of the write control signal (WC) pulse supplied at node 26. NAND element 60 actually performs an OR function in this embodiment, so the output of NAND element 50 is inverted and passed through NAND element 60 to node 76. Since the data input signal (DI) remains constant in write cycle 92, data transition detector 61 and NAND element 74 have no influence over the write transition detection signal (WTD) pulse.

The WTD pulse is passed through OR element 78 in a manner similar to the transmission of the ATD signal through OR element 78 discussed above in connection with READ memory cycle 90. Thus, the word line control signal (WL) pulse, the precharge signal (PC) pulse, and the sense amp latching signal (SAL) pulse each follow the WTD pulse as described above in connection with the ATD pulse of cycle 90. As discussed above in connection with cycle 90, the trailing edge of the word line control signal (WL) pulse, the precharge signal (PC) pulse, and the sense amp latching signal (SAL) pulse each occur around a single instant in time which is intermediate between the beginning and end of memory cycle 92. Specifically, the precharge signal (PC) becomes active prior to the end of write cycle 92.

Write cycle 94 resembles write cycle 92 in that it represents a sequence of events which may cause data to be written into memory device 10 (see FIG. 1). However, during write cycle 94, the data in signal (DI) changes state during the time that the write control signal (WC) remains active. The address remains constant throughout cycle 94; consequently, no ATD pulse is generated. A change in logical states of the data in signal (DI) applied at node 28 (see FIG. 2) of write detector 46 causes the new state to be written into memory element 10. This sequence of events is illustrated by the DI signal in cycle 94.

As the data input signal (DI) at node 28 changes from a logical 0 to a logical 1 state, NAND element 64 in cooperation with delay element 66 and inverter 62 detect this transition and supply a pulse to NAND element 72. NAND element 72 performs an OR function in this embodiment and passes the pulse along to NAND element 74. NAND element 74 provides an AND function in this embodiment, which is enabled only during the periods of time when the write control signal (WC) is active, as it is in memory cycle 94. Thus, this pulse is transmitted through NAND element 74 and NAND element 60, which performs an OR function. Consequently, a 0 to 1 transition of data at data input signal (DI) node 28 produces a write transition detection signal (WTD) pulse, as shown in memory cycle Moreover, a 1 to 0 transition of data at data input signal (DI) node 28 also causes such a write transition detection signal (WTD) pulse to occur. For a 1 to 0 transition, NAND element 68 in connection with inverters 70 and 62 and delay element 66 detect the transition and provide a pulse in response. NAND element 72 performs an OR function, which passes this pulse along to NAND element 74. Thus, data transition detector 61 provides a pulse whenever data provided at data input signal (DI) node 28 changes from a logical 0 to a logical 1 or a logical 1 to a logical 0. Those skilled in the art will recognize that other transition detection logic could be used in place of block 61.

The relationships between the write transition detection signal (WTD) pulse and the word line control signal (WC) pulse, the precharge signal (PC) pulse, and the sense amp latching signal (SAL) pulse are the same for write cycle 94 as discussed above in connection with write cycle 92. However, since the length of the write transition detection signal (WTD) pulse in write cycle is controlled by delay element 66 in data transition detector 61, and the length of the write transition detection pulse (WTD) in write cycle 92 is determined by the length of delay associated with delay element 48, these two pulses need not exhibit the same duration. In the preferred embodiment, each of these pulses are sufficiently long to successfully cause data to be stored in a specifically addressed cell 44 of memory device 10 (see FIG. 1). However, these pulses are advantageously as short as possible so that the time for which the precharge signal (PC) exhibits the active state is as long as possible after the trailing edge of the WTD pulse.

Figure 4:
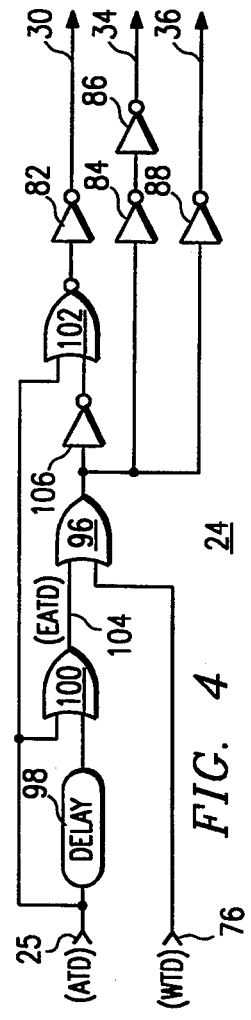
FIG. 4 shows a second embodiment of a logic diagram of the precharge and timing control circuit portion of the memory device as shown in FIG. 1.

FIG. 4 shows a logic diagram of a second embodiment of precharge timing and control circuit 24. In FIG. 4, the write transition detection signal (WTD) pulse output from write detector 46 (see FIG. 2) is supplied to a first input of an OR element 96. The second embodiment of precharge and timing control circuit 24 utilizes the same structure for write detector 46 as shown in FIG. 2. Consequently, the discussion presented above in connection with FIG. 2 applies to the second embodiment of FIG. 4. In FIG. 4, the address transition detection signal (ATD) pulse supplied by address transition detector 14 (see FIG. 1) at node 25 couples to an input of a delay element 98, a first input of an OR element 100, and a first input of a NOR element 102. An output of delay element 98 couples to a second input of OR element 100, and an output of OR element 100 provides an extended address transition detection signal (EATD) at a node 104, which couples to a second input of OR element 96. An output of OR element 96 couples to an input of an inverter 106, the input of inverter 84 (discussed above in connection with FIG. 2), and the input of inverter 88 (discussed above in connection with FIG. 2). The output of inverter 84 couples to the input of inverter 86, and an output of NOR element 102 couples to an input of inverter 82. The output of inverter 82 couples to a node 30 and provides the precharge signal (PC). The output of inverter 86 couples to node 34 and provides the word line control signal (WLC). In addition, the output of inverter 88 couples to node 36 and provides the sense amplifier latching control signal (SAL).

Figure 5:
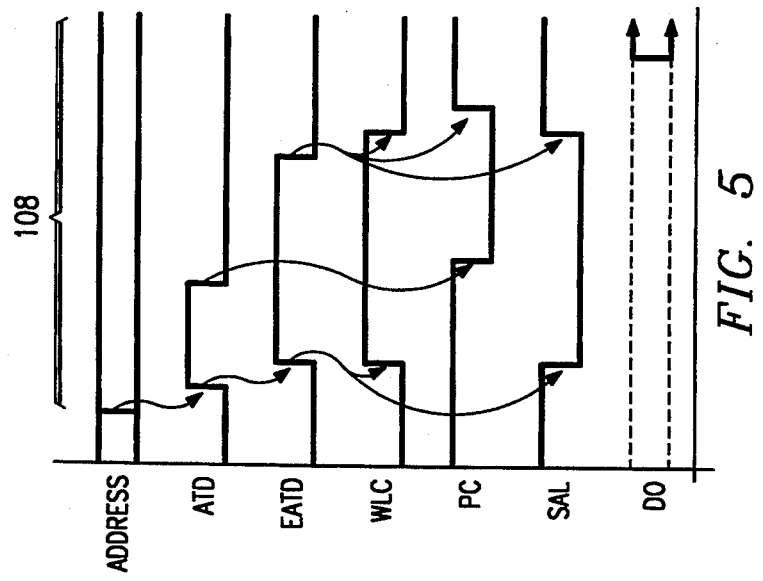
FIG. 5 shows a timing diagram which describes the operation of the precharge and timing control circuit shown in FIG. 4.

FIG. 5 shows a timing diagram which describes the operation of the second embodiment of precharge and timing control circuit 24. Referring to FIG. 5, a memory cycle 108 represents a read cycle. Read cycle 108 begins with an address transition, as shown in the address signal of FIG. 5. This address transition causes a leading edge of an address transition detection signal (ATD) pulse, as discussed above in connection with FIGS. 2 and 3A–C. The address transition detection (ATD) pulse is applied at node 25 in the FIG. 4 embodiment and is passed through delay element 98 and OR element 100 so that the leading edge of the address transition detection (ATD) pulse appears at the output of OR element 100 after only a small propagation delay associated with OR element 100, but the trailing edge of the address transition detection (ATD) pulse is delayed by a length of time associated with delay element 98 before it appears at the output of OR element 100. As a result, the extended address transition delay (EATD) pulse is produced at node 104, as shown in FIG. 5.

The leading edges of the address transition detection (ATD) pulse and the extended address transition detection (EATD) pulse generate leading edges of the word line control (WLC) pulse and the sense amp latching (SAL) pulse. However, these leading edges do not cause the precharge signal (PC) to deactivate. Rather, the precharge signal is held in the active state throughout the duration of the address transition detection (ATD) pulse, as shown in the precharge signal (PC) of FIG. 5. This occurs through the operation of NOR element 102 in FIG. 4. However, after the trailing edge of the address transition detection (ATD) pulse, the first input of NOR element 102 becomes enabled, and the extended address transition detection (EATD) pulse is transmitted through inverter 106, NOR element 102, and inverter 82 to cause the precharge signal (PC) to exhibit its inactive state. The trailing edge of the extended address transition detection (EATD) pulse initiates the trailing edges of the word line control signal (WLC) pulse, the sense amp latching signal (SAL) pulse, and the precharge signal (PC) pulse. In other words, the precharge signal (PC) exhibits the active state following the trailing edge of the extended address transition detection (EATD) pulse.

The structure shown in FIG. 4 does not include an optional delay element, such as delay element 80 which was discussed above in connection with FIG. 2. However, the propagation delay through elements 106, 102, and 82 is sufficient so that the trailing edge of the precharge signal (PC) pulse occurs after the trailing edge of the sense amp latching signal (SAL) pulse. In the structure shown in FIG. 2, the precharge signal (PC) pulse became inactive upon the leading edge of the address transition detection pulse (ATD). The structure shown in FIG. 4 differs from that structure in that it causes the precharge pulse to become inactive after the trailing edge of the address transition detection pulse (ATD). Consequently, the precharge signal remains in the active state for a longer period of time using the structure shown in FIG. 4.

Moreover, the delay associated with forcing the precharge signal to its inactive state in the FIG. 4 embodiment is substantial enough to ensure that the word line control signal (WLC) pulse is activated prior to the inactivation of the precharge signal (PC). This signalling sequence provides at least two specific advantages. This timing sequence guarantees that at least one of the write line control signal (WLC) or the precharge signal (PC) associated with an addressed memory cell 44 of memory cell array 22 (see FIG. 1) is active at all times. Thus, the bit lines are always in a controlled state and less likely to exhibit a wrong state even when subjected to intense radiation. If the bit lines were to go to a state opposite the state of the memory cell to be read, that cell could be upset, the read delayed, or an incorrect output could be generated. Moreover, the timing sequence produced by the structure of FIG. 4 allows the precharge signal to remain active for a longer period of time. As a result, smaller devices may be utilized in driving bit lines 32 of memory cell array 22 (see FIG. 1) to sufficiently equalize bit lines 32 when the precharge signal (PC) activates.

In summary, the present invention provides a memory device 10 in which a precharge portion of memory cycles does not occur in series with address value changes, address transition detection, word line and bit line stabilization, and device output propagation delays in memory device 10. Rather, the precharge portion of a memory cycle occurs at the end of a previous memory cycle, as disclosed by the structure in FIG. 2, or throughout the end of a previous memory cycle and during the beginning of a current cycle, as provided by the structure shown in FIG. 4. Consequently, memory read access cycles require less time, and smaller devices may be utilized to energize bit lines 32 to accomplish precharge.

Significant advantage can be realized from the portion of the invention which is the initiation of precharge upon the completion of writing information into the memory, independent of the method of precharge in the read cycle.

The foregoing description discusses preferred embodiments of the present invention which may be changed or modified without departing from the scope of the present invention. For example, those skilled in the art will understand that the logical elements described above may be formed using a wide variety of logical gates, employing any polarity of input or output signals, and that the logical values described above may be implemented using different voltage polarities. Moreover, those skilled in the art will recognize that the logic diagrams presented herein may be implemented utilizing conventional implementation techniques, and that the logic diagrams and timing diagrams presented above may be altered to change polarities or slightly alter timing. In addition, logic may be changed to accommodate different architectures. For example, address transition may be detected on all address bits instead of just row address bits. Moreover, the data transition detection could be omitted if the memory specification simply restricts the point in time at which data must be valid. Furthermore, for a clocked memory, timing could be referenced from a clock edge instead of from transition detections. These and other changes and modifications are intended to be included within the scope of the present invention.

What is claimed is:

1. A memory device which performs one of a storing data operation and a recalling data operation during a memory cycle, said memory device comprising:

a memory cell array including a bit line and a word line, said word line being activated during said memory cycle to provide access to memory cells within the array in connection with said storing data and recalling data operations;

a write and sense amplifier control circuit including a data input coupled to said bit line of said memory cell array and including a sense amplifier latch control input;

a latch controller, coupled to said sense amplifier latch control input, operable to latch a sense amplifier in said write and sense amplifier control circuit at a first instant in time;

a word line controller, coupled to said word line of said memory cell array, for deactivating said word line at around said first instant in time;

a precharge controller, coupled to said bit line of said memory cell array, for activating a precharge signal at around said first instant in time and before the end of said memory cycle, said precharge signal controlling precharging of said bit line and remaining active after the beginning of a successive memory cycle;

a write detector including inputs which receive a write control signal supplied to said memory device and a data input signal supplied to said memory device, said write detector including a data transition detector and having an output which supplies a write detection pulse to said precharge controller in response to changes of signal level in said data input signal or to changes at a predetermined edge of said write control signal, said precharge controller being operable so that said precharge signal exhibits an inactive state in response to said write detection pulse, said bit line being precharged within the same memory cycle that data transition detection by said data transition detector or write detection by said write detector occurs.

2. A memory circuit as claimed in claim 1 wherein said write detection pulse has a leading edge and a trailing edge;

said precharge controller being operable so that said precharge signal exhibits said inactive state in response to said leading edge of said write detection pulse.

3. A memory device as claimed in claim 1 wherein:
said write detection pulse has a leading edge and a trailing edge;
said precharge controller being operable so that said precharge signal exhibits said inactive state in response to said trailing edge of said write detection pulse.

4. A memory device as claimed in claim 1 wherein:
said write control signal supplied to said memory device forms a pulse having a leading edge and a trailing edge during said storing data operation; and
said write detector supplies said write detection pulse when said leading edge of said write control signal pulse occurs.

5. A memory device as claimed in claim 4 wherein said write detector prevents the occurrence of said write detection pulse when said trailing edge of said write control signal pulse occurs.

6. A memory device as claimed in claim 4 wherein said write detector supplies said write detection pulse during said write control signal pulse when said data input signal changes from a first logical state to a second logical state.

* * * * *